(12) United States Patent
Hasuda (10) Patent No.: US 10,468,228 B2
(45) Date of Patent: Nov. 5, 2019

(54) CHARGED PARTICLE BEAM APPARATUS

(71) Applicant: HITACHI HIGH-TECH SCIENCE CORPORATION, Minato-ku, Tokyo (JP)

(72) Inventor: Masakatsu Hasuda, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/936,174

(22) Filed: Mar. 26, 2018

(65) Prior Publication Data

US 2018/0286628 A1 Oct. 4, 2018

(30) Foreign Application Priority Data

Mar. 28, 2017 (JP) .................. 2017-062504

(51) Int. Cl.
*H01J 37/20* (2006.01)
(52) U.S. Cl.
CPC ..... *H01J 37/20* (2013.01); *H01J 2237/20207* (2013.01); *H01J 2237/20214* (2013.01)
(58) Field of Classification Search
CPC ............. H01J 37/20; H01J 2237/20207; H01J 2237/20214
USPC ................ 250/440.11, 441.11, 442.11, 443.1
See application file for complete search history.

(56) References Cited

U.S. PATENT DOCUMENTS

2013/0299697 A1* 11/2013 Enyama ................. H01J 37/12
250/307

FOREIGN PATENT DOCUMENTS

JP 2014063726 4/2014

\* cited by examiner

*Primary Examiner* — Nicole M Ippolito
(74) *Attorney, Agent, or Firm* — Adams & Wilks (57) ABSTRACT

A charged particle beam apparatus includes a charged particle beam column for irradiating a sample with a charged particle beam, and a sample stage unit for moving the sample relative to the charged particle beam column. The sample stage unit includes a rotary stage section having a base portion and a rotary mover rotatable about a rotary axis relative to the base portion. A rotary connector is disposed coaxially with and rotatable about the rotary axis and fitted between the base portion and the rotary mover for electrically connecting wirings between relatively rotating elements. A connection electrode is disposed on the sample stage unit in electrical connection with the rotary connector. In the charged particle beam apparatus, the sample is able to be rapidly placed and replaced.

10 Claims, 8 Drawing Sheets

CHARGED PARTICLE BEAM APPARATUS

CROSS REFERENCE TO RELATED APPLICATION(S)

This application claims the benefit of Japanese Patent Application No. 2017-062504, filed on Mar. 28, 2017, which is hereby incorporated by reference in its entirety into this application.

BACKGROUND OF THE INVENTION

1. Technical Field

The present invention relates generally to a charged particle beam apparatus.

2. Description of the Related Art

As well known to those skilled in the art, a charged particle beam is a general term for an ion beam and an electron beam. An apparatus for either of processing, observation, or analysis (e.g. observation) using a focused charged particle beam is called a charged particle beam apparatus. The charged particle beam apparatus is provided with at least one of an ion beam column for generating an ion beam and an electron beam column for generating an electron beam. The charged particle beam apparatus includes a composite charged particle beam apparatus having a plurality of charged particle beam columns.

Such a charged particle beam apparatus may be used for forming a lamella, for example. When a structure, such as a semiconductor device, is exposed from an observation face of a lamella, the processing rate of the charged particle beam varies due to the existence of the structure. Then, a so-called "curtain effect" occurs that the observation face is provided with uneven portions, forming a stem-like image.

For example, Patent Document 1 discloses a composite charged particle beam apparatus in which a sample holder for holding a sample is able to tilt in 2-axis directions to suppress the curtain effect.

DOCUMENT OF RELATED ART (Patent Document 1) Japanese Patent Application Publication No. 2014-063726

SUMMARY OF THE INVENTION

However, the conventional charged particle apparatus has the following problems.

In the composite charged particle beam apparatus disclosed in Patent Document 1, a sample is disposed at a location to which a charged particle beam for observation is able to be radiated, and in this state, finish milling is performed on the sample at least two times. For each finish milling, a charged particle beam for processing irradiates the sample in two different directions. For such milling, the sample is disposed at a suitable angle for the observation and processing by a first tilting unit. Further, the sample is moved by a second tilting unit, such that it is rotated within a processing face, in order to change a processing direction.

To facilitate the processing, it is important for the sample not to move out of an observation range of the charged particle beam for observation, when the sample is moved by the second tilting unit. Thus, there is a need to provide precise position-alignment of a sample on a sample holder. This causes a problem in that it takes time to place a sample on the sample holder before the processing. Since such placement is performed in a state in which a vacuum chamber is opened to the atmosphere, a time to stop operating the composite charged particle beam apparatus is prolonged, causing a problem of reduced actual operating time of the composite charged particle beam apparatus.

Accordingly, the present invention has been made keeping in mind the above problems occurring in the related art, and an object of the present invention is to provide a charged particle beam apparatus capable of performing rapid displacement and replacement of a sample.

In order to accomplish the above object, in a first aspect, the present invention provides a charged particle beam apparatus including: a charged particle beam column irradiating a sample with a charged particle beam; a sample stage unit moving the sample relative to the charged particle beam column, the sample stage unit including a rotary stage section having a base portion and a rotary mover rotating about a rotary axis relative to the base portion; a rotary connector fitted between the base portion and the rotary mover in a coaxial manner with the rotary axis; and a first connection electrode disposed on the sample stage unit in electrical connection with the rotary connector.

The charged particle beam apparatus may further include: a sample holder detachably disposed on the sample stage unit, the sample holder having a second connection electrode detachably connectable to the first connection electrode, a sample holding portion holding the sample, and a holder-side moving stage section moving the sample holding portion; and a sample holder controller transmitting a control signal to the sample holder via the rotary connector when the second connection electrode of the sample holder is electrically connected to the first connection electrode.

The holder-side moving stage section may include a 2-axis tilting stage section rotating about a first axis and a second axis orthogonal to the first axis.

The sample stage unit may include a holder lock member locking a position of the sample holder with the second connection electrode of the sample holder press-connected to the first connection electrode.

The charged particle beam column may have a plurality of charged particle beam columns.

According to the charged particle beam apparatus, the sample can be rapidly placed and replaced.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The present invention will be described in detail below with reference to the accompanying drawings.

Figure 1:
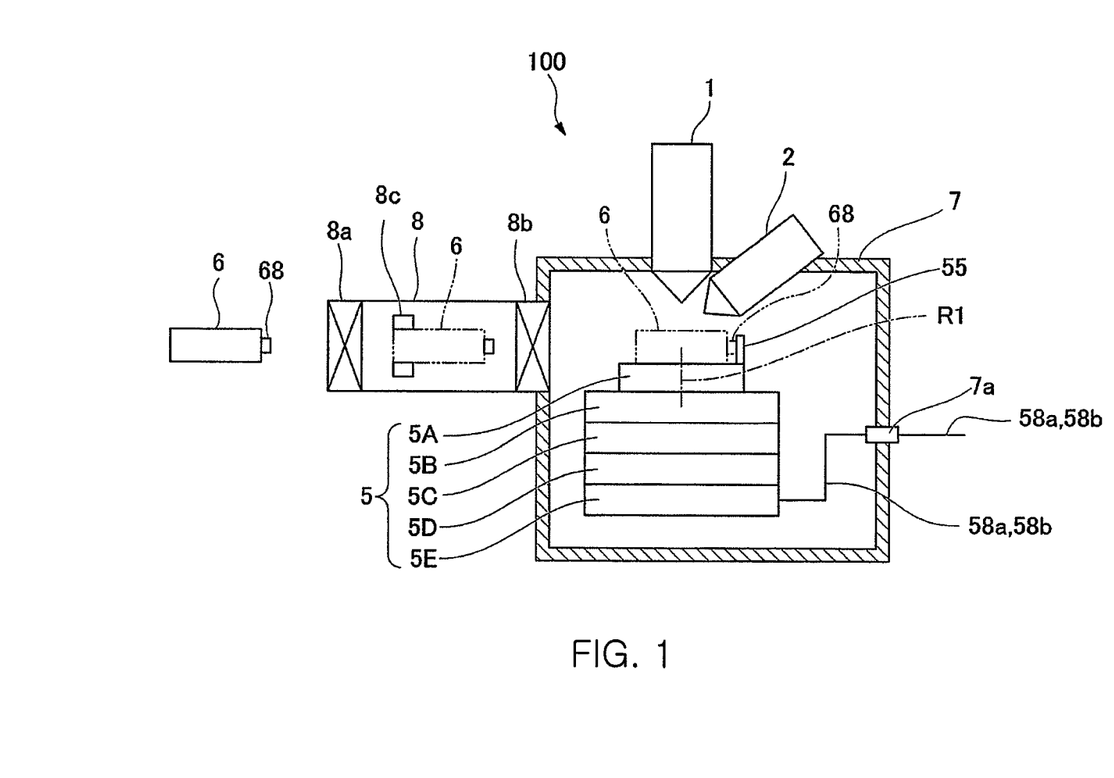
FIG. 1 is a schematic diagram of an exemplary configuration of a charged particle beam apparatus according to embodiments of the present invention.
Figure 2:
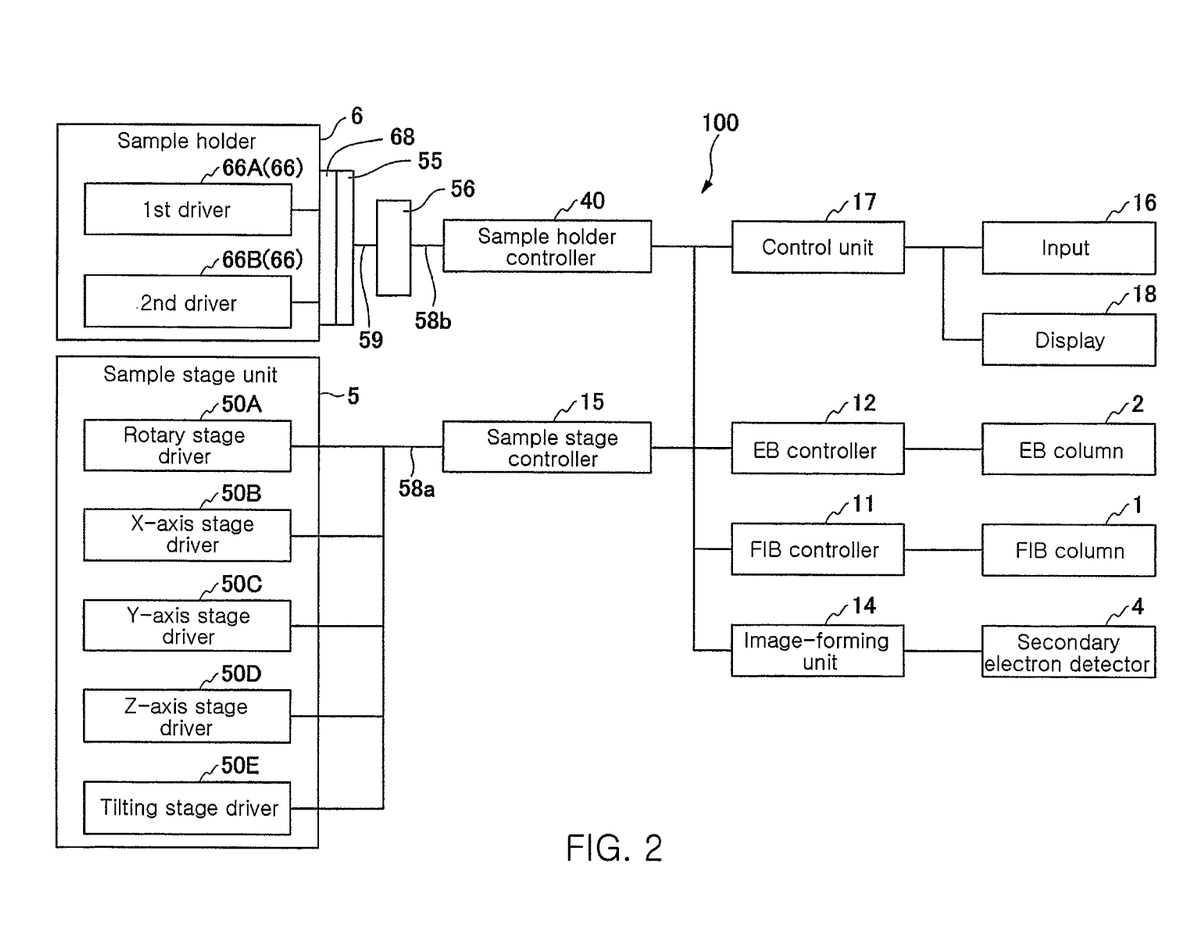
FIG. 2 is a block diagram of an exemplary configuration of a control system of the charged particle beam apparatus according to embodiments of the present invention.
Figure 3:
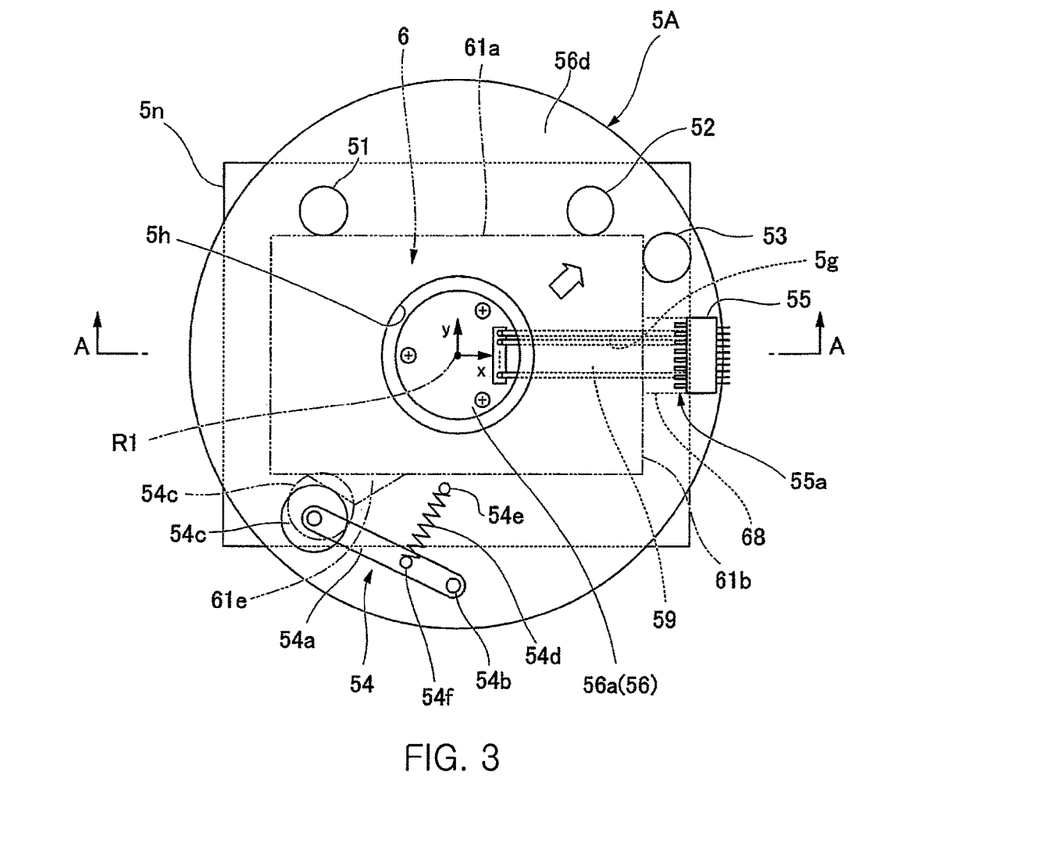
FIG. 3 is a schematic plan view of major parts of the charged particle beam apparatus according to embodiments of the present invention.
Figure 4:
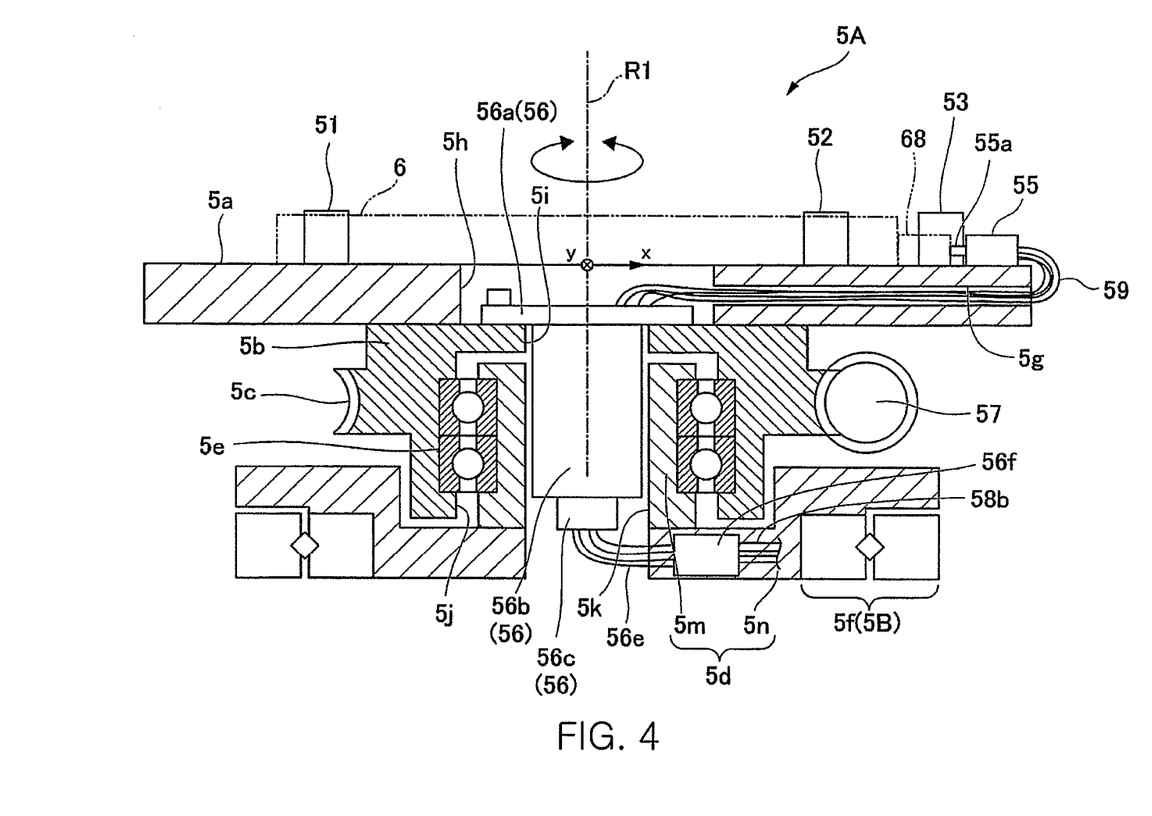
FIG. 4 is a cross-sectional view taken along line A-A of FIG. 3.

FIG. 1 is a schematic diagram of an exemplary configuration of a charged particle beam apparatus according to embodiments of the present invention. FIG. 2 is a block diagram of an exemplary configuration of a control system of the charged particle beam apparatus according to embodiments of the present invention. FIG. 3 is a schematic plan view of major parts of the charged particle beam apparatus according to embodiments of the present invention. FIG. 4 is a cross-sectional view taken along line A-A of FIG. 3. Since the figures are schematic views, shapes or sizes of elements depicted in the drawings may be exaggerated (which is the same in the remaining drawings).

A charged particle beam apparatus 100 (hereinafter also referred to as an apparatus 100) illustrated in FIG. 1 is provided to perform either of processing, observation, or analysis of a sample. The apparatus 100 may be a focused ion beam apparatus, a scanning electron microscope, etc., for example.

If the apparatus 100 is a processing apparatus, the apparatus may include at least one of an etching gas supply and a deposition gas supply (not shown), if needed.

The apparatus 100 can irradiate a suitable charged particle beam for a sample according to applications. The charged particle beam irradiated by the apparatus 100 may be at least one of an ion beam and an electron beam.

In the present embodiment, the charged particle beam apparatus 100 includes a sample chamber 7, a sample stage unit 5, an FIB column 1 (a charged particle beam column), an EB column 2 (a charged particle beam column), a load lock chamber 8, and a sample holder 6.

The sample chamber 7 accommodates a sample on which at least one operation of processing, observation, and analysis is performed by the charged particle beam apparatus 100. A vacuum exhaust apparatus (not shown) is connected to the sample chamber 7 to change and maintain vacuum level inside the sample chamber 7.

The sample stage unit 5 is provided in the sample chamber 7. In the sample chamber 7, the FIB column 1 and the EB column 2 are disposed oppositely to the sample stage unit 5.

As illustrated in FIG. 1, the sample stage unit 5 is a 5-axis stage unit that consists of a rotary stage section 5A, an X-axis stage section 5B, a Y-axis stage section 5C, a Z-axis stage section 5D, and a tilting stage section 5E, which are stacked on one another. The stacked order of the respective stage sections is not specifically limited. In FIG. 1, for example, the rotary stage section 5A, the X-axis stage section 5B, the Y-axis stage section 5C, the Z-axis stage section 5D, and the tilting stage section 5E are sequentially stacked from an upper portion of the stage unit. Hereinafter, the rotary stage section 5A, the X-axis stage section 5B, the Y-axis stage section 5C, the Z-axis stage section 5D, and the tilting stage section 5E may also be simply collectively referred to as a "stage section 5A to 5E".

As illustrated in FIG. 2, the sample stage unit 5 includes a rotary stage section driver 50A, an X-axis stage driver 50B, a Y-axis stage driver 50C, a Z-axis stage driver 50D, and a tilting stage driver 50E for driving the stage sections 5A to 5E, respectively. Hereinafter, the rotary stage section driver 50A, the X-axis stage driver 50B, the Y-axis stage driver 50C, the Z-axis stage driver SOD, and the tilting stage driver 50E may also be simply collectively referred to as "stage drivers 50A to 50E".

The stage drivers 50A to 50E respectively include a proper motor as a driving source. The stage drivers 50A to 50E may respectively include a gear mechanism or the like, if needed.

The stage driver 50A to 50E is communicatingly connected to a sample stage controller 15 to be described below via a first wiring 58a. The stage driver 50A to 50E is controlled in response to a control signal from the sample stage controller 15.

In the present embodiment, the sample stage controller 15 is disposed outside the sample chamber 7. Thus, as illustrated in FIG. 1, the first wiring 58a connected to the stage driver 50A to 50E is extended out of the sample stage unit 5. The first wiring 58a is extended out of the sample chamber 7 through a feed-through 7a, which is provided to the sample chamber 7 while passing through the same.

Although not specifically illustrated, respective wirings connected to the stage drivers 50A to 50E may be guided in the sample chamber 7 by a movable cable guide, such as e.g. Cableveyor (registered trademark), if needed.

As illustrated in FIG. 1, in the present embodiment, the rotary stage section 5A is disposed at a highest position of the sample stage unit 5. The rotary stage section 5A is configured to be rotatable about a rotary axis R1. The rotary axis R1 is parallel with a vertical axis when the tilting stage section 5E is moved to a reference position for a tilting motion.

As illustrated in FIGS. 3 and 4, the rotary stage section 5A includes a sample stage portion 5a (rotary mover), a rotary shaft portion 5b (rotary mover, FIG. 4), and a base portion 5d (FIG. 4).

As illustrated in FIG. 4, the sample stage portion 5a is a disk member disposed at a highest position of the rotary stage section 5A. An upper surface of the sample stage portion 5a is a plane that is perpendicular to the rotary axis R1. Hereinafter, when explaining a position of the plane along the rotary axis R1 in the rotary stage section 5A, an xy coordinate system described in FIG. 3 is used. The xy coordinate system is a coordinate system fixed to the sample stage portion 5a. In FIG. 3, an x-axis is an axis that extends from left to right, and a y-axis is an axis that extends upwards from the bottom perpendicularly to the x-axis. The origin of the xy coordinate system is an intersection point between the x-axis, the y-axis, and the rotary axis R1.

On the sample stage portion 5a, positioning pins 51, 52, 53 as a positioning member stand erect to position the sample holder 6 to be described later. However, the positioning member for positioning the sample holder 6 is not limited to such a pin member, but may employ a positioning protrusion or recess having a suitable shape.

The positioning pins 51 and 52 lie collinearly along the x-axis on opposite sides of the y-axis. The positioning pins 51 and 52 are positioned on opposite sides of the y-axis in the positive direction of the y-axis from the x-axis. The positioning pins 51 and 52 position the sample holder 6 in the y-axis direction.

The positioning pin 53 positions the sample holder 6 in the x-direction which was positioned by the positioning pins 51 and 52 in the y-direction. In the present embodiment, the positioning pin 53 is on the positive side of the x-axis from the positioning pin 52, and is positioned between the positioning pin 52 and the x-axis in the y-axis direction.

The sample holder 6 that was positioned by the positioning pins 51, 52, and 53 will be hereinafter referred to as the "positioned sample holder 6".

A lock mechanism 54 (holder lock) is disposed on the sample stage portion 5a on opposite side to the positioning pin 51 in the y-axis direction.

The lock mechanism 54 is a mechanism that forces the sample holder 6 against the positioning pins 51, 52, and 53 on the sample stage portion 5a to thereby lock the sample holder 6.

The lock mechanism 54 may have a specified configuration according to the shape of the sample holder 6. In FIG. 3, for example, the lock mechanism 54 has an arm 54a, a pressing roller 54c, and a tension spring 54d.

A first end (right end in the drawing) of the arm 54a is supported by a rotary support shaft 54b standing erect on the sample stage portion 5a such that it is rotatable in a plane parallel with the xy plane. On a second end of the arm 54a opposite to the first end, the pressing roller 54c able to contact a lateral side of the sample holder 6 is rotatably installed. A rotary axis of the pressing roller 54c is parallel with the rotary axis R1.

Opposite ends of the tension spring 54d are engaged between an engaging shaft 54e standing erect on the sample stage portion 5a and an engaging part 54f of the arm 54a. The engaging shaft 54e stands erect on the sample stage portion 5a on the more positive side of the y-axis than the rotary support shaft 54b. The engaging part 54f is disposed between the first and second ends of the arm 54a.

In an inactivated state of the tension spring 54d, the pressing roller 54c is normally positioned as indicated with two-dot chain line in the drawing. In the normal state, a distance between the pressing roller 54c and the positioning pin 51 in the y-axis direction is slightly smaller than a width between lateral sides of the positioned sample holder 6 in the y-axis direction.

As the arm 54a rotates in a counterclockwise direction as illustrated so that the tension spring 54d is elongated, an elastic restoration force is created. If so, the arm 54a is applied with moment of force in the clockwise direction as illustrated about the rotary support shaft 54d.

On the sample stage portion 5a, a connection terminal 55 is disposed at a position that is positive from a negative-side end of the positioning pin 53 in the x-axis direction and opposite to the positive side-face of the positioned sample holder 6 in the x-axis direction.

The connection terminal 55 has a contact pin part 55a (first connection electrode) for electrical connection with the positioned sample holder 6. A third wiring 59 is electrically coupled to the contact pin part 55a in the connection terminal 55.

The configuration of the contact pin part 55a is not specifically limited so long as it can be electrically connected to an electrode of the positioned sample holder 6. For example, if the electrode of the sample holder 6 is a stationary electrode, the contact pin part 55a may be a spring connector pin part in which pins are to be elastically forced in the negative x-axis direction by means of a spring. Alternatively, the contact pin part 55a may be composed of an elastic member, such as a leaf spring, a coil spring, or the like, in which pins themselves can electrically force the electrode of the positioned sample holder 6 in a negative direction of the x-axis.

For example, if the electrode of the sample holder 6 is elastic, the contact pin part 55a may be a stationary electrode.

The contact pin is installed such as the number of the contact pin is the number of the signal line or the power line which the sample holder 6 needs or more.

The third wiring 59 is provided to electrically connect the connection terminal 55 and a rotary connector 56 to be described later. The third wiring 59 may include a wiring member that is easy to be interconnected. The type of the third wiring 59 is not particularly limited so long as it does not interfere with the operation of the sample stage unit 5. For example, the third wiring 59 may use an electric wire, a cable tying electric wires, a flat cable, a flexible board cable, a circuit board, a metal plate, or the like.

For example, the third wiring 59 shown in FIGS. 3 and 4 is composed of a plurality of individual electric wires.

The third wiring 59 is disposed along a suitable path that does not interfere with the operation of the sample stage unit 5. For example, in the present embodiment, the third wiring 59 extends into a penetration hole 5h of the sample stage portion 5a through a wiring guide 5g in the sample stage portion 5a. Thus, the third wiring 59 is accommodated in the sample stage portion 5a without being not substantially radially exposed to the outside of the sample stage portion 5a. When the sample stage portion 5a rotates, the third wiring 59 is rotated along with the sample stage portion.

As illustrated in FIG. 4, the rotary shaft 5b is a cylindrical member that is installed coaxially with the rotary axis R1 on an undersurface of the sample stage portion 5a. The rotary shaft 5b has a penetration hole 5i at the center of the rotary shaft 5b, that is coaxial with the penetration hole 5h of the sample stage portion.

An intermediate hole 5j of the rotary shaft 5b is provided with a bearing 5e having ball bearings and the like such that an outer wheel of the bearing 5e is fixed to an inner circumference of the intermediate hole 5j.

The rotary shaft 5b is provided with a worm wheel 5c on an outer circumference thereof.

The worm wheel 5c meshes with a worm gear 57 extending in the y-axis direction. The worm gear 57 is connected to the rotary stage section driver 50A which is not shown.

The base portion 5d has a cylindrical portion 5m coaxial with the rotary axis R1, and a planar portion 5n radially extending outward from a lower end of the cylindrical portion 5m.

The cylindrical portion 5m is inserted into the intermediate hole 5j of the rotary shaft 5b from a lower side of the intermediate hole 5j.

An inner wheel of the bearing 5e is attached to an outer circumference of the cylindrical portion 5m, so that the base portion 5d and the rotary shaft 5b are connected so as to be relatively rotatable about the rotary axis R1.

An inner diameter of an inner circumference 5k of the cylindrical portion 5m has a size sufficient to insert the rotary connector 56 thereinto in a non-contact manner.

As illustrated in FIG. 3, the planar portion 5n has a rectangular shape in a plan view.

As illustrated in FIG. 4, under an outer circumference of the planar portion 5n, a linear bearing 5f, which is disposed on the X-axis stage section 5B, is connected. Thus, the base portion 5d can be guided by the linear bearing 5f and linearly moved along inside direction illustrated in FIG. 4.

According to the above configuration, when a motor (not shown) of the rotary stage section driver 50A is activated, the worm gear 57 rotates according to the rotary direction of the motor so that a rotary driving force is transferred to the worm wheel 5c. Then, the rotary shaft 5b is rotated relative to the base portion 5d about the rotary axis R1. The rotary direction of the rotary shaft 5b is defined by the rotary direction of the worm gear 57 and an inclined direction of a tooth of the worm gear 57.

In the rotary stage section 5A, the sample stage portion 5a and the rotary shaft 5b form a rotary mover rotating about the rotary axis R1 relative to the base portion 5d.

As illustrated in FIG. 4, the rotary connector 56 is attached to the rotary stage section 5A.

The rotary connector 56 is a connection member that electrically connects wirings between relatively rotating elements. The rotary connector 56 more preferably has a configuration that operates in response to endless rotation. However, if the rotary stage section 5A has a restricted rotary range according to its application, the rotary connector may have a rotary range corresponding to the restricted rotary range of the rotary stage section 5A.

The rotary connector 56 may be a rotary connector using a slip ring, liquid metal, or the like, for example.

For example, in the present embodiment, an endlessly rotatable slip ring is used.

The rotary connector 56 has a flange-type first end 56a, a cylindrical casing 56b, and a tubular second end 56c.

The first end 56a is inserted into the penetration hole 5h of the sample stage portion 5a and fixed to an upper end of the rotary shaft 5b. The first end 56a is provided with the connection terminal 56d (FIG. 3) to electrically connect the third wiring 59.

The casing 56b is fixed to the first end 56a. The casing 56b has an outer diameter that is equal to or smaller than an inner diameter of the penetration hole 5i or smaller than an inner diameter of the inner circumference 5k. Thus, the casing 56b is inserted into the cylindrical portion 5m of the base portion 5d in a non-contact state.

A slip ring mechanism, which is not shown in the drawing, is disposed in the casing 56b.

The second end 56c protrudes downwards from a central portion of the casing 56b. The second end 56c is connected to a rotor of the slip ring mechanism, which is not shown. A connection lead 56e electrically coupled to the connection terminal 56d extends from a leading side of the second end 56c through a rotary electrode of the slip ring mechanism.

A leading side of the connection lead 56e is provided with a connector 56f to be connected to a following second wiring 58b. The connector 56f is fixed to the planar portion 5n of the base portion 5d.

As illustrated in FIG. 2, the second wiring 58b electrically connects the rotary connector 56 and a sample holder controller 40 to be described below. The sample holder controller 40 is disposed outside of the sample chamber 7. Thus, as illustrated in FIG. 1, like the first wiring 58a, the second wiring 58b is extended to the outside of the sample chamber 7 through the feed-through 7a.

The second wiring 58b may extend parallel with the first wiring 58a in the sample chamber 7, if needed. Alternatively, the second wiring 58b can be arranged using a cable together with the first wiring 58a.

As illustrated in FIG. 1, the X-axis stage section 5B is fixed to the lower side of the rotary stage section 5A through the linear bearing 5f (FIG. 4). The X-axis stage section 5B is a single-axis stage section which translates the rotary stage section 5A along an axis orthogonal to the rotary axis R1 when applied with a driving force from the X-axis stage driver 50B.

The Y-axis stage section 5C is fixed to the lower side of the X-axis stage section 5B through the linear bearing, not shown. The Y-axis stage section 5C is a single-axis stage section which translates the X-axis stage section 5B along that axis when applied with a driving force from the Y-axis stage driver 50C, not shown. The Y-axis stage section 5C moves the X-axis stage section 5B along an axis orthogonal to the movement direction of the X-axis stage section 5B and the rotary axis R1.

The Z-axis stage section 5D is fixed to the lower side of the Y-axis stage section 5C. The Z-axis stage section 5D is a single-axis stage section which translates the Y-axis stage section 5C in a direction along the rotary axis R1 when applied with a driving force from the Z-axis stage driver 50D, not shown.

The tilting stage section 5E is fixed to the lower side of the Z-axis stage section 5D. The Z-axis stage section 5E is a single-axis stage section which tilts the Z-axis stage section 5D when applied with a driving force from the tilting stage driver 50E, not shown. The tilting stage section 5E tilts the Z-axis stage section 5D such that the movement direction of the Z-axis stage section 5D tilts in a plane including a vertical axis.

At a reference position for tilting of the tilting stage section 5E, the movement direction of the Z-axis stage section 5D coincides with the vertical direction.

As illustrated in FIG. 1, the FIB column 1 is disposed upwards oppositely to the sample stage unit 5. In the present embodiment, for example, the FIB column 1 is disposed along the vertical axis.

The FIB column 1 irradiates a focused ion beam (FIB) as a first charged particle beam. The FIB column 1 is provided with a liquid metal ion source, for example.

The EB column 2 is disposed upwards from the sample stage unit 5 along an inclined axis to the vertical axis. The EB column 2 irradiates an electron beam (EB) as a second charged particle beam.

As illustrated in FIG. 2, the charged particle beam apparatus 100 includes a secondary electron detector 4 which detects secondary electrons emitted from a sample by irradiation of EB or FIB. Further, the charged particle beam apparatus 100 may include a back-scattered electron detector which detects back-scattered electrons emitted from a sample by irradiation of EB.

In the charged particle beam apparatus 100, as illustrated in FIG. 1, an FIB-irradiation axis of the FIB column 1 and an EB-irradiation axis of the EB column 2 intersect with each other in order to observe an FIB processed sample 37 with a scanning electron microscope (SEM). In the charged particle beam apparatus 100, a sample is arranged at an intersection point between the FIB-irradiation axis and the EB-irradiation axis by position alignment of the sample using the sample stage unit 5.

As illustrated in FIG. 1, the load lock chamber 8 is provided in order to load or unload a sample into or from the sample chamber 7 while maintaining a vacuum state of the sample chamber 7.

The load lock chamber 8 includes a first sealing door 8a, a second sealing door 8b, a transfer mechanism 8c, a vacuum pump (not shown), and a purge gas supply (not shown).

The first sealing door 8a opens and closes a first opening able to communicate with the outside of the charged particle beam apparatus 100. The second sealing door 8b opens and closes a second opening able to communicate between the load lock chamber 8 and the sample chamber 7.

The first and second openings are provided oppositely to a space above the sample stage unit 5 in a horizontal direction (left-right direction in FIG. 1) of the space.

The transfer mechanism 8c is a mechanism which transfer a sample introduced into the load lock chamber 8 towards the sample stage unit 5 under remote control. The transfer mechanism 8c may include a horizontal-motion stage, a remote-controlled arm, a remote-controlled robot, or the like, for example.

The not-shown vacuum pump vacuumizes the load lock chamber while the first and second openings 8a and 8b are closed. The not-shown purge gas supply supplies a purge gas to the inside of the load lock chamber 8 in order to make the load lock chamber 8 have an atmospheric pressure while the first and second openings 8a and 8b are closed.

The sample holder 6 will now be described.

Figure 5:
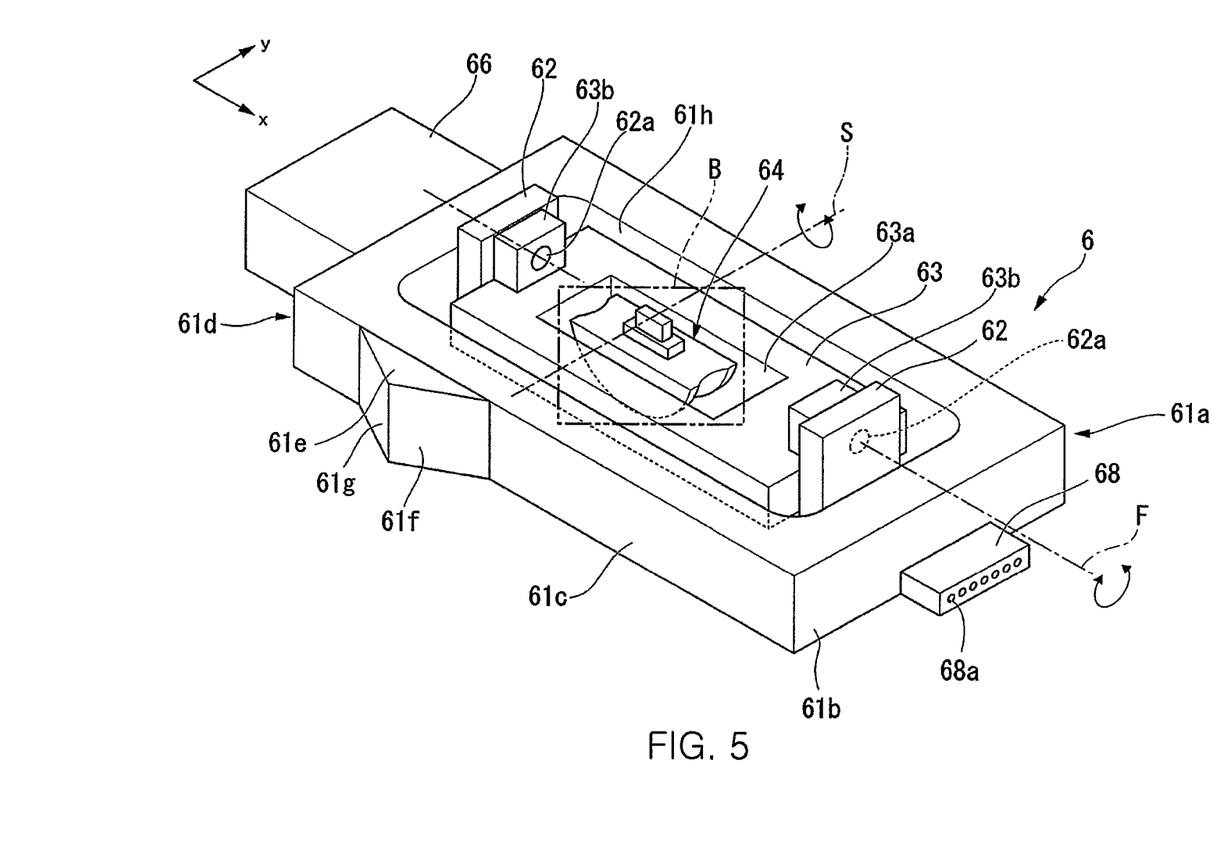
FIG. 5 is a schematic perspective view of an exemplary sample holder of the charged particle beam apparatus according to embodiments of the present invention.
Figure 6:
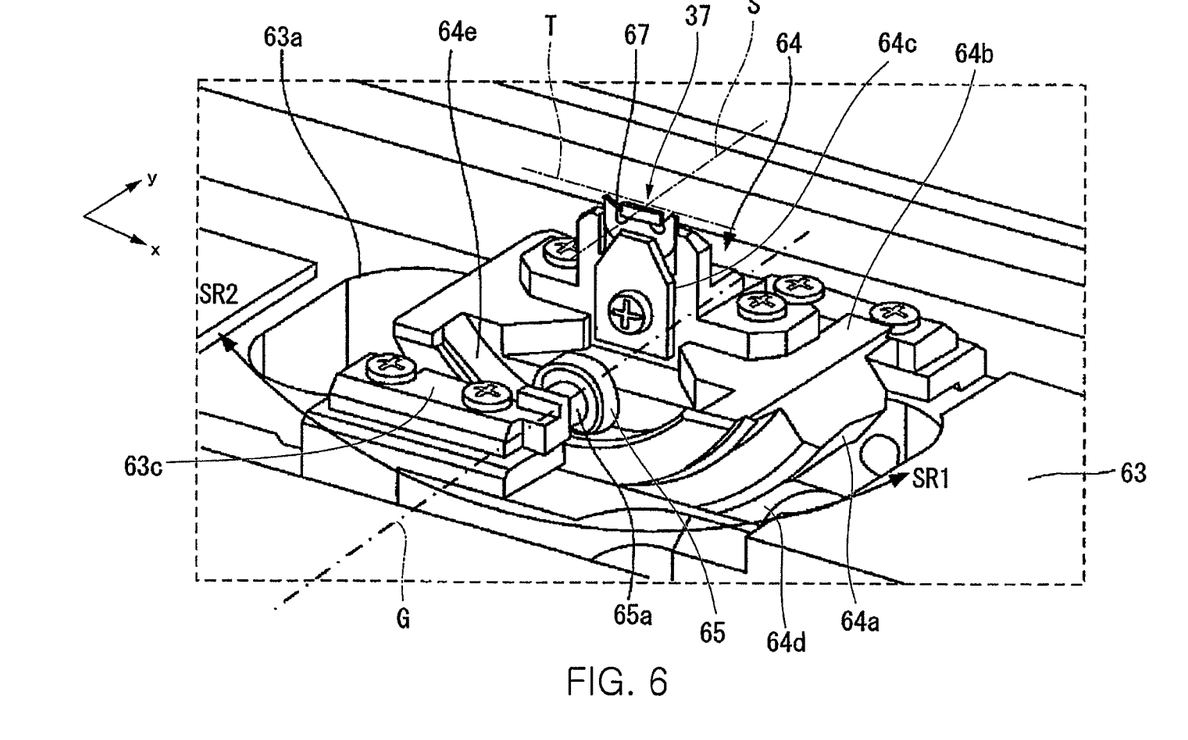
FIG. 6 is an enlarged view of section B of FIG. 5.
Figure 7A:
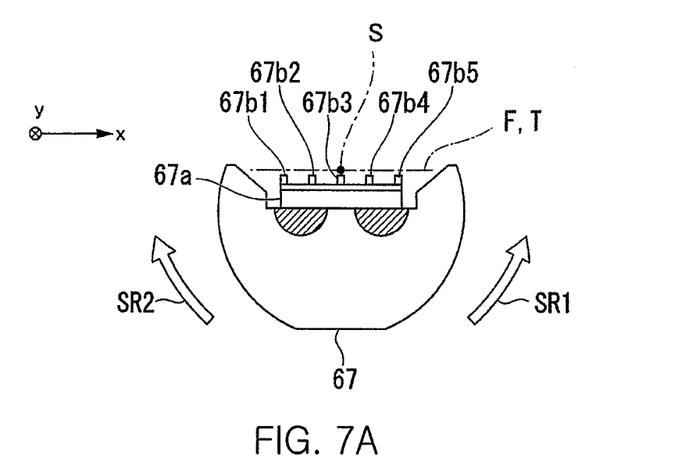
FIGS. 7A and 7B illustrate a sample and its holding shape in the charged particle beam apparatus according to embodiments of the present invention, which are schematically shown in both front and side views.
Figure 7B:
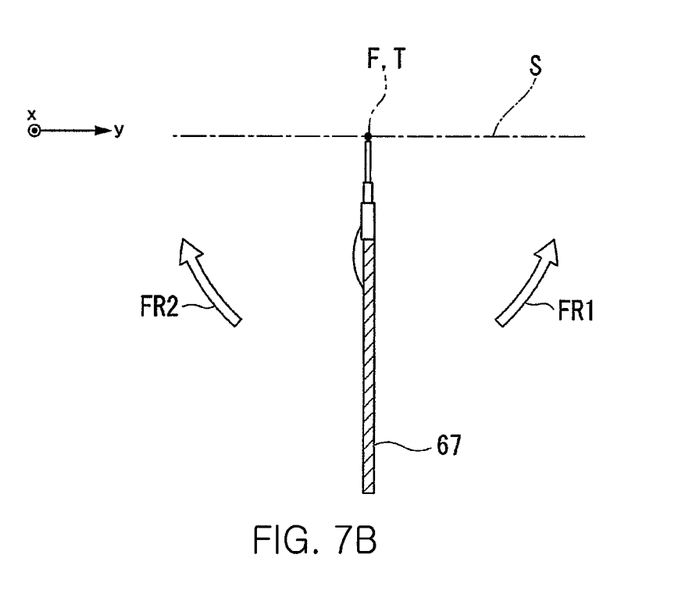
Figure 8:
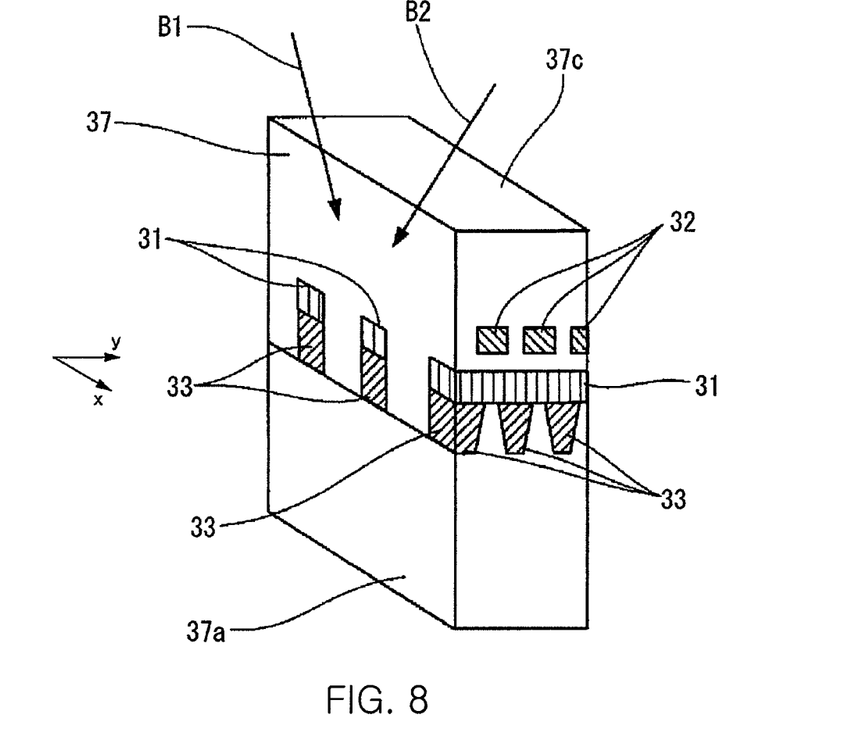
FIG. 8 is a schematic perspective view illustrating a relationship between a sample and a processing direction for the sample in the charged particle beam apparatus according to embodiments of the present invention.

FIG. 5 is a schematic perspective view of an exemplary sample holder of the charged particle beam apparatus according to embodiments of the present invention. FIG. 6 is an enlarged view of section B of FIG. 5. FIG. 7A and FIG. 7B illustrates a sample and its holding shape in the charged particle beam apparatus according to embodiments of the present invention, which are schematically shown in both front and side views (a) and (b). FIG. 8 is a schematic perspective view illustrating a relationship between a sample and a processing direction for the sample in the charged particle beam apparatus according to embodiments of the present invention.

As illustrated in FIG. 5, the sample holder 6 includes a base stage 61, a support part 62, a rotary stage section 63 (holder-side moving stage), a tilting stage 64 (holder-side moving stage), and a driving part 66. However, for easy illustration, major parts are only schematically shown in FIG. 5.

When describing the configuration of the sample holder 6, an xy coordinate system will also be referred according to a position of the positioned sample holder 6.

The base stage 61 has a configuration that is able to be loaded onto an upper surface of the sample stage unit 5 and to be positioned in 2-axis directions in the upper surface of the sample stage unit 5 as well. Specifically, the base stage 61 can be positioned in 2-axis directions in an upper surface of the sample stage portion 5a of the rotary stage section 5A of the sample stage unit 5 by the positioning pins 51, 52, and 53 on the sample stage portion 5a. In an example shown in FIG. 5, the base stage 61 is composed of a plate member having a substantially rectangular shape in a plan view. The base stage 61 has sides 61a, 61b, 61c, and 61d.

The side 61a is a plane that is provided on the positive side of the y-axis of the base stage 61, extending in the x-axis direction. The side 61a is able to contact the positioning pins 51 and 52 in the y-axis direction.

The side 61b is a plane that is adjacent to the side 61a on the positive side of the x-axis, extending in the y-axis direction. The side 61b is able to contact the positioning pin 53 in the x-axis direction.

The side 61c is opposite to the side 61a in the y-axis direction. On the side 61c, an inclined block 61e protrudes in a negative direction of the y-axis at a position adjacent to a negative side of the x-axis. The inclined block 61e has a bottom part, a first inclined face 61f, and a second inclined face 61g, forming a triangular shaped projection viewed from the bottom part so that the first and second faces intersect with each other at an apex. The first inclined face 61f is inclined towards and meets the side 61c as it goes in the positive direction of the x-axis from the protruded apex formed with the second inclined face. Further, the second inclined face 61g is also inclined towards and meets the side 61c as it goes in the negative direction of the x-axis from the protruded apex formed with the first inclined face 61f.

As illustrated in FIG. 3, the positioned sample holder 6 and the lock mechanism 54 have the position relationship in which the second inclined face 61g of the inclined block 61e is forced in the positive directions of both the x-axis and the y-axis by the pressing roller 54c of the lock mechanism 54.

The side 61d is opposite to the side 61b in the x-axis direction. In the present embodiment, the driving part 66 for driving the rotary stage section 63 and the tilting stage 64 is attached to the side 61d.

As illustrated in FIG. 2, the driving part 66 includes a first driver 66A for driving the rotary stage section 63, and a second driver 66B for driving the tilting stage 64.

The configurations of the first and second drivers 66A and 66B are not particularly limited so long as they can respectively drive the rotary stage section 63 and the tilting stage 64 using a combination with an electric moving device, not shown. For example, the first and second drivers 66A and 66B may use a rotary or linear electric motor.

As illustrated in FIG. 5, a connector 68 is attached to the side 61b. The connector 68 has connection electrodes 68a (second connection electrodes) which are to be respectively connected to electric wirings installed to the sample holder 6.

The connection electrodes 68a are disposed at a position where the connection electrodes abut against the contact pin part 55a of the connection terminal 55 when the sample holder 6 is positioned. The connection electrodes 68a are electrically connected to not-shown electronic parts provided in the sample holder 6 via not-shown wirings. In the present embodiment, the connection electrodes 68a are electrically connected to the first and second drivers 66A and 66B. Thus, the number of the connection electrodes 68a corresponds to at least the number of signal lines and power lines required for the operation of the first and second drivers 66A and 66B.

The base stage 61 is provided on an upper surface thereof with a recess 61h having a substantially rectangular shape in a plan view.

In the recess 61h, support parts 62 are installed to stand at each opposite end sides in x-axis respectively. Further, support shafts 62a are installed to extend coaxially with an axis F (first axis) parallel to x-axis at each of the support parts 62 respectively.

In the recess 61h, the rotary stage section 63 having a rectangular shape in a plan view is disposed between the support parts 62. Opposite end sides of the rotary stage section 63 in the x-axis direction are respectively provided, on the upper surface thereof, with bearings 63b which are rotatably coupled to support shafts 62a of the support parts 62. According to this configuration, the rotary stage section 63 is supported so as to be rotatable about an axis F.

The rotary stage section 63 is connected to the not-shown first driver 66A via the not-shown electric device. The rotary stage section 63 rotates about the axis F when receiving the driving force from the not-shown first driver 66A via the not-shown electric device. When the rotary stage section 63 rotates about the axis F, the rotary stage section 63 tilts in the y-axis direction.

The rotary stage section 63 is provided with a central opening 63a which opens upwards. The opening 63a accommodates the tilting stage 64 therein. The position of the tilting stage 64 in the y-axis direction is positioned by not-shown positioning members provided on an inner circumference of the opening 63a.

FIG. 6 illustrates an exemplary detailed configuration of the tilting stage 64. As illustrated in FIG. 6, the tilting stage 64 has a substantially semi-circular shape in the y-axis direction. A circular outer circumference of the tilting stage 64 is provided with a worm wheel 64*a*.

The y-axis side of the tilting stage 64 is provided with a guide groove 64*e* that is curved concentrically with a pitch circle of the worm wheel 64*a*.

On a planar part 64*b* of the tilting stage 64 opposite to the worm wheel 64*a*, a sample holding portion 64*c* is disposed to hold the sample 37 using a TEM grid 67.

As illustrated in FIGS. 7A and 7B, the TEM grid 67 is formed from a thin plate having a central sample holding stage part 67*a*. Five posts 67*b*1, 67*b*2, 67*b*3, 67*b*4, and 67*b*5 are provided on the sample holding stage part 67*a*.

An exemplary sample to be mounted on the posts 67*b*1 to 67*b*5 may be a sheet-like sample 37 shown in FIG. 8, for example.

The sample 37 is prepared by cutting a portion of a semiconductor device, for example. The sample 37 has structures 31, 32, and 33 of a device. The structures 31 and 33 are exposed from a sectional surface 37*a* as an observation surface. The samples 37 are mounted on the posts 67*b*1 to 67*b*5 such that FIB or EB is irradiated from a lateral side of an upper surface 37*c*.

In the present embodiment, when the tilting stage 64 lies at a reference position, the sample is mounted such that a normal direction of the sectional surface 37*a* of the sample 37 (a thickness direction of the sample 37) substantially coincides with the y-axis direction.

As illustrated in FIG. 6, a worm gear 64*d* is disposed in the rotary stage section 63 below the tilting stage 64. The worm gear 64*d* extends parallel with the x-axis and meshes with the worm wheel 64*a* of the tilting stage 64 from the lower side of the worm wheel. The worm gear 64*d* is connected to the second driver 66B via a not-shown electric device.

An axial distance between the worm wheel 64*a* and the worm gear 64*d* is restricted by a roller 65 which is to be electrically-movably abutted against the guide groove 64*e*. The roller 65 is supported by a support shaft 65*a* extending in a positive direction of the y-axis from a support part 63*c* on the rotary stage section 63 so as to be rotatable about an axis G parallel with the y-axis.

When the worm gear 64*d* is driven by the second driver 66B, the tilting stage 64 is rotated with the axial distance between the worm gear 64*d* and the worm wheel 64*a* maintained by the roller 65. As a result, the tilting stage 64 rotates about an axis S (second axis) passing through the center of a pitch circle of the worm wheel 64*a* parallel with the y-axis, so that the planar part 64*b* tilts in the x-axis direction. When the rotary direction of the worm gear 64*d* changes, the tilting stage 64 tilts in the opposite direction.

Accordingly, the sample holder 6 has the 2-axis tilting stage configuration in which the rotary stage section 63 and the planar part 64*b* of the tilting stage 64 tilt in the y-axis direction with the rotation about the axis F, and the planar part 64*b* of the tilting stage 64 tilts in the x-axis direction with the rotation about the axis S as well.

In the present embodiment, an intersection between the axes F and S lies on the rotary axis R1 of the rotary stage section 5A in a position-aligned state.

The configuration of the control system of the charged particle beam apparatus 100 will now be described.

As illustrated in FIG. 2, the charged particle beam apparatus 100 includes a sample stage controller 15, a sample holder controller 40, an FIB controller 11, an EB controller 12, an image-forming unit 14, and a control unit 17.

The sample stage controller 15 is communicatingly connected to the stage drivers 50A to 50E of the sample stage unit 5 via the first wiring 58*a*. The sample stage controller 15 controls the stage drivers 50A to 50E to move the stage sections 5A to 5E of the sample stage unit 5 in response to control signals from the control unit 17.

The sample holder controller 40 is electrically connected to the connection terminal 55 via the second wiring 58*b* and the rotary connector 56. As described later, when the sample holder 6 is disposed on the sample stage unit 5 in a positioned state, the connector 68 is connected to the connection terminal 55. In this case, the sample holder controller 40 is communicatingly connected to the first and second drivers 66A and 66B of the sample holder 6.

The sample holder controller 40 controls the first and second drivers 66A and 66B to tilt the tilting stage 64 in 2-axis directions in response to control signals from the control unit 17, when the sample holder 6 is connected. Thus, the sample holder controller 40 can change the tilting direction of the sample 37 held on the sample holder 6 with respect to the vertical axis in the 2-axis directions.

The FIB controller 11 controls the irradiation of FIB from the FIB column 1 in response to a control signal from the control unit 17.

The EB controller 12 controls the irradiation of EB from the EB column 2 in response to a control signal from the control unit 17.

The image-forming unit 14 forms an SEM image using e.g. an EB scanning signal from the EB controller 12 and a secondary electron signal detected by the secondary electron detector 4. Further, the image-forming unit 14 forms a scanning ion microscope (SIM) image using an FIB scanning signal from the FIB controller 11 and a secondary electron signal detected by the secondary electron detector 4.

The SEM image and the SIM image formed by the image-forming unit 14 are transmitted to the control unit 17.

The control unit 17 is communicatingly connected to the sample stage controller 15, the sample holder controller 40, the FIB controller 11, the EB controller 12, the image-forming unit 14, an input 16, and a display 18.

The input 16 is a unit through which an operator inputs a command to operate the charged particle beam apparatus 100. The command input to the input 16 is transmitted to the control unit 17.

The display 18 is a unit on which information transmitted from the control unit 17 is displayed.

The control unit 17 analyzes the input command transmitted from the input 16 to generate a control signal for controlling the entire of the charged particle beam apparatus 100. The control unit 17 transmits the generated control signal to the sample stage controller 15, the sample holder controller 40, the FIB controller 11, the EB controller 12, or the image-forming unit 14 as needed.

The control unit 17 transmits and displays information about an observation image, such as an SEM image, an SIM image, or the like, transmitted from the image-forming unit 14 and information such as various control conditions of the charged particle beam apparatus 100 to and on the display 18.

The control operation of the control unit 17 will be described later, together with the operation of the charged particle beam apparatus 100.

The configuration of the control system composed of the sample stage controller 15, the sample holder controller 40, the FIB controller 11, the EB controller 12, the image-forming unit 14, the control unit 17 may employ a computer composed of suitable hardware, CPU, memory, I/O interface, external storage, and the like. A portion or all of control functions of the control system may be implemented by executing control programs for implementing respective control functions, using a computer.

Next, the operation of the charged particle beam apparatus 100 will be described with reference to the operations of the sample holder 6 and the sample stage unit 5.

The charged particle beam apparatus 100 may perform either of processing, observation, or analysis of a sample 37 in response to an input command from an input 16.

The sample 37 is formed into a predetermined size, and then held in a TEM grid 67, for example. As illustrated in FIG. 6, the TEM grid 67 is held in the sample holding portion 64c on the tilting stage 64 of the sample holder 6. Here, the TEM grid 67 is held in the sample holding portion 64c such that a line T connecting upper surfaces of the respective samples 37 is substantially parallel with the axis F (FIGS. 7A and 7B), and the line T is substantially level with the axis S. The placement of the TEM grid 67 is performed with the sample holder 6 discharged out of the charged particle beam apparatus 100. Thus, a precise position alignment can be achieved by using a suitable jig, a measuring device, or the like. Further, the placement of the TEM grid 67 can be performed by other operator than the operator of the charged particle beam apparatus 100.

Along with this, the operation of the charged particle beam apparatus 100 is prepared. For example, the sample chamber 7 is vacuumized in a state in which the first and second sealing doors 8a and 8b of the load lock chamber 8 is closed. The sample stage unit 5 is initialized such that the stage sections 5A to 5E have respective reference positions for movement. A purge gas is introduced into the load lock chamber 8 so that the load lock chamber 8 has an atmospheric pressure.

Then, the sample holder 6 is loaded on the sample stage unit 5 of the charged particle beam apparatus 100.

Specifically, an operator introduces the sample holder 6 into the load lock chamber 8 by opening the first sealing door 8a of the load lock chamber 8. Here, as illustrated in FIG. 1, the sample holder 6 is introduced such that the connector 68 of the sample holder 6 faces the connection terminal 55 on the sample stage unit 5 in the sample chamber 7.

The operator vacuumizes the load lock chamber 8 by activating the vacuum pump after closing the first sealing door 8a. When the load lock chamber 8 has the same vacuum level as the sample chamber 7, the operator opens the second sealing door 8b.

Then, the operator remotely controls the transfer mechanism 8c of the load lock chamber 8 to move the sample holder 6 onto the upper surface of the sample stage portion 5a of the sample stage unit 5.

As illustrated in FIG. 3, on the upper surface of the sample stage portion 5a, at a position opposite to the connection terminal 55 in the x-axis direction, a distance between the positioning pin 51 and the pressing roller 54c in the y-axis direction is initially slightly smaller than a width of the sample holder 6 in the y-axis direction. For loading of the sample holder onto the sample stage portion, the sample holder 6 is inserted between the positioning pin 51 and the pressing roller 54c and moved in the positive direction of the x-axis while sliding over the sample stage unit 5, by the transfer mechanism 8c.

In the process of insertion of the sample holder, the side 61a abuts with the positioning pins 51, 52 and the side 61c is pressed by the pressing roller 54c. When the pressing roller 54c slides over the inclined block 61e of the side 61c, the inclined block 61e is applied with a greater pressing force from the pressing roller 54c in a direction indicated with an arrow in FIG. 3. With this pressing force, the sides 61a and 61b of the sample holder 6 abut with a pressing force against the positioning pins 51 and 52, and the positioning pin 53, respectively. As a result, the sample holder 6 is positioned on the sample stage portion 5a in both the x-axis and y-axis directions.

In this positioned state, since the pressing roller 54c abuts against the first inclined face 61g of the inclined block 61e, the position of the sample holder 6 is locked by the lock mechanism 54.

In the positioned state, the connection electrodes 68a of the connector 68 in the sample holder 6 are press-connected with the corresponding contact pin part 55a of the connection terminal 55. Thus, the wirings (not shown) of the sample holder 6 and the third wiring 59 are electrically connected.

As illustrated in FIG. 4, the third wiring 59 is electrically connected to the second wiring 58b via the rotary connector 56 and the connector 56f. With the configuration of the rotary connector 56, the electric connection between the third wiring 59 and the second wiring 58b is maintained even during rotation of the rotary stage section 5A.

As described above, the sample holder 6 is loaded onto the sample stage portion.

Subsequently, at least one of processing, observation, and analysis of a sample 37 can be performed using the charged particle beam apparatus 100 by an operator or an input command from the input 16.

For example, an operator displays an SEM image or an SIM image of the sample 37 on the display 18. The operator sets an irradiation region of FIB based on an observation image of the sample, such as an SEM image, an SIM image, or the like, displayed on the display 18. The operator inputs, to the input 16, a command to set an irradiation region to the observation image displayed on the display 18.

For example, when the operator inputs a command to start processing to the input 16, the control unit 17 transmits the irradiation region and a processing-start signal to the FIB controller 11, which irradiates FIB to the set irradiation region of the sample 37. Thus, FIB irradiates the irradiation region input by the operator.

In the charged particle beam apparatus 100, in order to observe the sample 37 with SEM during processing the sample 37 in FIB, as illustrated in FIG. 1, the FIB-irradiation axis of the FIB column 1 and the EB-irradiation axis of the EB column 2 intersect with each other. The operator aligns the sample 37 with the intersection point between the FIB-irradiation axis and the EB-irradiation axis by driving the sample stage unit 5.

In this state, when a command is input to rotate the rotary stage section 5A, the sample 37 rotates about the rotary axis R1 to a position able to observe an SEM image.

Further, when a command is input to rotate the tilting stage 64 of the sample holder 6 about the axis F or S, the sample 37 tilts in the y-axis or x-axis direction to a position able to observe an SEM image. Here, the tilting in the x-axis direction indicates the tilting in the direction shown with arrows SR1 and SR2 in FIG. 7A. The tilting in the y-axis direction indicates the tilting in the direction shown with arrows FR1 and FR2 in FIG. 7B.

Thus, in the charged particle beam apparatus 100, after the alignment of the sample 37 is performed, both the rotation of the sample 37 about the rotary axis R1 while maintaining eucentric state and the tilting of the sample in the x-axis or y-axis direction can be accomplished with ease and high precision.

Accordingly, the charged particle beam apparatus 100 can perform the processing capable of restricting the curtain effect.

For example, as illustrated in FIG. 8, the sample 37 is moved by the sample stage unit 5 and the sample holder 6, and irradiated with a charged particle beam so as to process a sectional surface 37a. In this case, the sectional surface 37a has different etching rates at a structure 31, 33-exposed region, and a remaining semiconductor-exposed region. The sectional surface 37a thus has irregularities. This phenomenon is called the curtain effect.

When SEM-observing the sectional surface 37a having irregularities, the observation image contains a stem image due to the irregularities. This stem image is formed due to an ion beam processing, so it does not indicate a structure of a semiconductor device or defect. If such a stem image occurs in the observation image, it may be difficult to analyze whether the stem image is caused from a structure of a semiconductor device or defect, or other sources.

However, according to the charged particle beam apparatus 100, the irradiation direction of a charged particle beam can be easily changed in an arrow B2 while maintaining eucentric state by tilting the tilting stage 64 in the x-axis direction from the above-mentioned state. For example, even when the sectional surface 37a tilts in the y-axis direction due to a mounting error of the TEM grid 67, or the like, the rotation is conducted in the surface of the sectional surface 37a by slightly adjusting the tilting of the sectional surface in the y-axis direction while observing the sectional surface 37a.

Like this, the finish milling in which a charged particle beam is irradiated along the sectional surface 37a from multiple directions is repeated, thereby reducing the irregularities created due to the curtain effect.

When processing, observation, and analysis of the sample 37 is completed, an operator unloads the sample holder 6 by reversing the loading procedure of the sample holder 6. Specifically, the operator opens the second sealing door 8b and remotely controls the transfer mechanism 8c to move the sample holder 6 in the negative direction of the x-axis. The connector 68 and the connection terminal 55, which were detachably press-fitted together, can be easily separated when the sample holder 6 is moved in the negative direction of the x-axis.

The operator closes the second sealing door 8b and introduces a purge gas into the load lock chamber 8. When the load lock chamber 8 has an atmospheric pressure, the operator opens the first sealing door 8a and unloads the sample holder 6 out of the load lock chamber 8.

During the unloading process, the sample chamber 7 maintains a vacuum state. Thus, when another sample holder 6 is instantly introduced into the sample chamber 7, another sample 37 can be continuously processed, observed, and analyzed.

Like this, according to the charged particle beam apparatus 100, the operator can load the sample holder 6 holding a sample 37, which is previously position-adjusted at the outside of the apparatus, onto the sample stage unit 5, without opening the sample chamber 7 to the atmosphere. Further, the operator can replace the sample holder 6 in the sample chamber 7 with other sample holder 6 without opening the sample chamber 7 to the atmosphere.

Thus, processing efficiency of a sample 37 and operating efficiency of the charged particle beam apparatus 100 can be improved.

While the foregoing description has illustrated the exemplarily embodiment in which the FIB column 1 is disposed in a vertical direction and the EB column 2 is disposed so as to be inclined to the vertical axis, the position relationship of the FIB column 1 and the EB column 2 may be reversed.

While the foregoing description has illustrated that the charged particle beam is FIB and EB, the charged particle beam is not limited to the FIB and EB. For example, a gas ion beam (GIB) may be used as a third charged particle beam.

Alternatively, the charged particle beam apparatus may use a single kind of charged particle beam.

While the foregoing description has illustrated that the sample 37 is held in the TEM grid 67, the holding method of the sample on the tilting stage 64 is not limited to the TEM grid 67.

The foregoing description has illustrated that the sample holder 6 has the 2-axis tilting stage.

However, the sample holder is not limited to the above-mentioned configuration so long as it can hold a sample and it has electronic parts for supplying an electric signal or power from the outside. For example, the sample holder may further include a translating stage or a rotary stage section, or otherwise may only include a translating stage or a rotary stage section.

Further, electronic parts of the sample holder are not limited to the moving stage. For example, an ion beam apparatus, an electronic beam current measuring device, an EBIC measuring device, an RCI measuring device, a nano-probing device, a tensile stress testing device, or the like may be used.

While the foregoing description has illustrated that the first and second connection electrodes are electrically connected together by means of physical contact, the first and second connection electrodes may be electrically connected in a non-contact manner, so long as they can supply a signal or power required for a sample holder. Non-contact electric connection may be an electronically-induced connection, for example.

While the foregoing description has illustrated that all of the connector 68, the connection terminal 55, and the rotary connector 56 are electric connectors, the connector 68, the connection terminal 55, and the rotary connector 56 may include an optical connector and an optical rotary connector.

While the foregoing description has illustrated that the driving part 66 is installed to the side of the base stage 61, the driving part 66 may be disposed in the base stage 61.

Although the preferred embodiments of the present invention have been disclosed for illustrative purposes, the present invention is not limited to such preferred embodiments. Those skilled in the art will appreciate that various modifications, additions and substitutions are possible, without departing from the scope and spirit of the invention.

Further, the technical scope of the present invention is not limited to the disclosed description, but should be defined by the accompanying claims.

What is claimed is:
1. A charged particle beam apparatus comprising:
a charged particle beam column that irradiates a sample with a charged particle beam;
a sample stage unit that moves the sample relative to the charged particle beam column, the sample stage unit including a rotary stage section having a base portion and a rotary mover rotatable about a rotary axis relative to the base portion;
a rotary connector disposed coaxially with and rotatable about the rotary axis and fitted between the base portion and the rotary mover for electrically connecting wirings between relatively rotating elements; and a first connection electrode disposed on the sample stage unit in electrical connection with the rotary connector.

2. The charged particle beam apparatus according to claim 1, further comprising:
   a sample holder detachably disposed on the sample stage unit, the sample holder having a second connection electrode detachably connectable to the first connection electrode, a sample holding portion for holding the sample, and a holder-side moving stage section that moves the sample holding portion; and
   a sample holder controller that transmits a control signal to the sample holder via the rotary connector when the second connection electrode of the sample holder is electrically connected to the first connection electrode.

3. The charged particle beam apparatus according to claim 2, wherein the holder-side moving stage section includes a 2-axis tilting stage section rotatable about a first axis and a second axis orthogonal to the first axis.

4. The charged particle beam apparatus according to claim 3, wherein the sample stage unit includes a holder for lock member locking a position of the sample holder with the second connection electrode of the sample holder press-connected to the first connection electrode.

5. The charged particle beam apparatus according to claim 4, wherein a plurality of charged particle beam columns are provided.

6. The charged particle beam apparatus according to claim 3, wherein a plurality of charged particle beam columns are provided.

7. The charged particle beam apparatus according to claim 2, wherein the sample stage unit includes a holder lock member for locking a position of the sample holder with the second connection electrode of the sample holder press-connected to the first connection electrode.

8. The charged particle beam apparatus according to claim 7, wherein a plurality of charged particle beam columns are provided.

9. The charged particle beam apparatus according to claim 2, wherein a plurality of charged particle beam columns are provided.

10. The charged particle beam apparatus according to claim 1, wherein a plurality of charged particle beam columns are provided.

* * * * *